(12) United States Patent
Nihei (10) Patent No.: US 7,675,220 B2
(45) Date of Patent: Mar. 9, 2010

(54) METHOD OF DRIVING PIEZOELECTRIC DEVICES

(75) Inventor: Yasukazu Nihei, Kanagawa (JP)

(73) Assignee: Fujifilm Corporation, Tokyo (JP)

( * ) Notice: Subject to any disclaimer, the term of this patent is extended or adjusted under 35 U.S.C. 154(b) by 0 days.

(21) Appl. No.: 12/205,402

(22) Filed: Sep. 5, 2008

(65) Prior Publication Data

US 2009/0009031 A1    Jan. 8, 2009

(30) Foreign Application Priority Data

Sep. 14, 2007   (JP) .............................. 2007-239099

(51) Int. Cl.
   *H01L 41/09* (2006.01)
(52) U.S. Cl. ..................................... 310/317
(58) Field of Classification Search ................... 310/317
   See application file for complete search history.

(56) References Cited

U.S. PATENT DOCUMENTS

2004/0135472 A1 *   7/2004   Kita et al. .................... 310/328

FOREIGN PATENT DOCUMENTS

| JP | 62-057265 | * | 3/1987 |
| JP | 5-338150 A | | 12/1993 |
| JP | 6-342946 A | | 12/1994 |
| JP | 2007-103893 | * | 4/2007 |

* cited by examiner

*Primary Examiner*—Thomas M Dougherty
(74) *Attorney, Agent, or Firm*—Birch, Stewart, Kolasch & Birch, LLP (57) ABSTRACT

The driving method includes a first drive step of applying a specified drive voltage to a piezoelectric film to drive a piezoelectric device during a first drive period, a standby step of suspending a drive of the piezoelectric device to keep the piezoelectric device on standby during a drive standby period and a second drive step of applying the specified drive voltage to the piezoelectric film to drive the piezoelectric device during a second drive period that follows the first drive period. During the drive standby period between the first drive period and the second drive period, a reverse electric field with respect to a drive electric field formed in the piezoelectric film by the specified drive voltage routinely applied during a drive of the piezoelectric device is applied to the piezoelectric film for a specified period of time.

11 Claims, 4 Drawing Sheets

METHOD OF DRIVING PIEZOELECTRIC DEVICES

The entire contents of documents cited in this specification are incorporated herein by reference.

BACKGROUND OF THE INVENTION

The present invention relates to a method of driving piezoelectric devices fitted with piezoelectric films having a perovskite-type crystal structure represented by the general formula $Pb(Ti_x,Zr_y,M_z)O_3$; in particular, the present invention relates to a method of driving such piezoelectric devices in a way that improves their durability.

In recent years, active R&D efforts are being directed to various kinds of devices that use the piezoelectric element, as exemplified by actuators, sensors and memory devices, and piezoelectric films that are formed by vapor-phase growth techniques such as sputtering are drawing particular attention as functional films capable of high performance. Such piezoelectric films are currently used in piezoelectric devices such as piezoelectric actuators in ink-jet heads, micro-pumps and so forth.

JP 5-338150 A discloses an ink-jet head and a method of driving it; in the ink-jet head, an electric pulse is applied to a piezoelectric material to cause partial deformation of an ink chamber, whereupon a pressure pulse is generated within the ink chamber so that an ink drop is ejected from a nozzle. According to JP 5-338150 A, the application of the electric pulse that causes ejection of an ink drop is followed by the application of an additional electric pulse that produces a voltage of opposite polarity with respect to the first applied electric pulse, whereby the ink meniscus is rapidly reverted to the reference state so that the response frequency of the ink-jet head is sufficiently increased to enable faster marking.

JP 6-342946 A discloses a method of regenerating a piezoelectric device which is characterized in that in order to restore the displacement performance of a piezoelectric device that has deteriorated in that performance due to prolonged use, an electric field at least equal to the coercive electric field is applied to the piezoelectric device in opposite direction with respect to the electric field applied during the drive mode. According to JP 6-342946 A, the disclosed method of regenerating a piezoelectric device is such that the piezoelectric device, namely, a piezoelectric film that has been driven for a prolonged time to have an internal electric field formed in it is supplied with an electric field at least equal to the coercive electric field of the piezoelectric film in opposite direction with respect to the electric field applied during the drive mode, whereupon the internal electric field is destroyed to restore the displacement performance of the piezoelectric film.

SUMMARY OF THE INVENTION

The displacement performance of piezoelectric films (elements) decreases, i.e., they deteriorate, in a hotter and more humid environment. The study of the present inventors has revealed that when piezoelectric devices using piezoelectric films based on $Pb(Ti_x,Zr_y,M_z)O_3$ compounds having the perovskite structure, such as lead zirconate titanate (PZT), were kept supplied with a drive electric field in one direction for driving the piezoelectric device, a compound of the site A element in the piezoelectric film, namely, a Pb compound precipitated at the negative electrode to lower the piezoelectric performance of the piezoelectric film.

This drop in the piezoelectric performance of the piezoelectric film is assumed to take place through the following process. First, on account of the drive electric field applied to the piezoelectric film in order to drive the piezoelectric device, site A ions in the piezoelectric film, namely, Pb ions are attracted toward the negative electrode. Then, the attracted site A ions might react with moisture at high frequency to form a compound, say, an oxide of the site A element which is eventually precipitated. In this way, the displacement performance of the piezoelectric film decreases and its deterioration progresses.

With the piezoelectric films having the $Pb(Ti_x,Zr_y,M_z)O_3$ based perovskite structure, a columnar grain boundary structure is preferably present since this contributes to providing a higher piezoelectric constant. However, it has been found by the study of the present inventors that the above-described deterioration of the piezoelectric element due to the precipitation of the Pb compound as a compound of the site A element is markedly noticeable in piezoelectric elements having the columnar grain boundary structure.

As described above, if, due to the electric field applied to the piezoelectric film (piezoelectric element) and the moisture around the piezoelectric film, the site A ions migrate and cause precipitation of the compound of site A element, the composition of the piezoelectric film changes irreversibly and its displacement performance (piezoelectric constant) will drop. Since this drop in the displacement performance of the piezoelectric film results from the irreversible change of the piezoelectric film, it is impossible to restore the lowered displacement performance. Therefore, preventing the deterioration of the piezoelectric film due to the migration of the site A ions and precipitation of the compound thereof is an important issue that should be addressed to improve the durability of the piezoelectric film.

In the drive method disclosed in JP 5-338150 A, a reverse voltage with the opposite polarity is applied for rapid reversion of the ink meniscus to the reference state; however, this voltage application needs to be performed upon each ink ejection and the reverse voltage has to be applied within one period of intrinsic vibration of the liquid to be ejected, with an additional disadvantage of the drive sequence becoming complicated. What is more, the magnitude of the reverse voltage and the timing of its application are set in accordance with the intrinsic vibration period of volume velocity that depends on such factors as the characteristics of the liquid to be ejected and the configuration of the ink-jet head but not set with a view to preventing the deterioration of the piezoelectric film. Further in addition, JP 5-338150 A does not address the above-described deterioration of the piezoelectric element.

In JP 6-342946 A, a reverse electric field is applied in opposite direction with respect to the drive electric field and with a strength at least equal to the coercive electric field; as a result, the piezoelectric film undergoes an inversion of the internal polarization, whereupon its piezoelectric performance decreases. As a further problem, in order to regenerate the piezoelectric performance that has decreased on account of the inversion of the internal polarization, it is necessary to perform the step of re-inverting the polarization.

An object, therefore, of the present invention is to solve the aforementioned problems of the prior art and provide a method by which piezoelectric devices having $Pb(Ti_x,Zr_y,M_z)O_3$ based piezoelectric films with the perovskite structure can be driven in such a way that the decrease in the piezoelectric performance due to the precipitation of the site A ions as the compound of site A element in the piezoelectric film can be prevented to improve the durability of the piezoelectric device.

In order to solve the problems and to attain the object as described above, the present invention provides a method of driving a piezoelectric device comprising a substrate, a substrate-side electrode formed on the substrate, a piezoelectric film formed on the substrate-side electrode and having a perovskite-type crystal structure represented by the general formula $Pb(Ti_x,Zr_y,M_z)O_3$, and an obverse-surface-side electrode formed on the piezoelectric film, comprising: a first drive step of applying a specified drive voltage between the obverse-surface-side electrode and the substrate-side electrode to drive the piezoelectric device during a first drive period; a standby step of suspending a drive of the piezoelectric device to keep the piezoelectric device on standby during a drive standby period; and a second drive step of applying the specified drive voltage between the obverse-surface-side electrode and the substrate-side electrode to drive the piezoelectric device during a second drive period that follows the first drive period, wherein during the drive standby period between the first drive period and the second drive period, a reverse electric field with respect to a drive electric field formed in the piezoelectric film by the specified drive voltage routinely applied during a drive of the piezoelectric device is applied to the piezoelectric film for a specified period of time.

In the present invention, preferably, the drive electric field is applied in such a direction that site A ions in the piezoelectric film are attracted toward the obverse-surface-side electrode.

Further, preferably, strength of the reverse electric field is not greater than a coercive electric field of the piezoelectric film, and the strength of the reverse electric field is at least 10% of the coercive electric field of the piezoelectric film.

Preferably, the reverse electric field is formed by applying a reverse field applying voltage which is reverse to the specified drive voltage between the substrate-side electrode and the obverse-surface-side electrode, the reverse field applying voltage being not greater than a DC voltage that forms the coercive electric field of the piezoelectric film, and the reverse field applying voltage is at least equal to a DC voltage that forms an electric field with a strength which is 10% of the coercive electric field of the piezoelectric film.

Preferably, the first drive period is a time that corresponds to a number of cycles to start of reverse field application at a point in time when application of the reverse electric field is started, the number of cycles to start of reverse field application being set on the basis of but smaller than a number of cycles to deterioration that represents a range from start of continuously driving the piezoelectric device through cycles with the specified drive voltage to a time when a compound of a site A element that has been generated by reaction between site A ions and moisture that is present at the obverse-surface-side electrode toward which the site A ions have been attracted by the drive electric field, and wherein the specified period of time for which the reverse electric field is applied to the piezoelectric film is a reverse field application time that is set in accordance with the number of cycles to start of reverse field application.

Or, preferably, the first drive period is a time that corresponds to a number of cycles to start of reverse field application at a point in time when application of the reverse electric field is started, the number of cycles to start of reverse field application being set on the basis of but smaller than a number of cycles to deterioration that represents a range from start of continuously driving the piezoelectric device through cycles with the specified drive voltage to a time when an amount of displacement of the piezoelectric film begins to decrease, and wherein the specified period of time for which the reverse electric field is applied to the piezoelectric film is a reverse field application time that is set in accordance with the number of cycles to start of reverse field application.

Here, preferably, the reverse field application time Tr is at least equal to a minimum reverse field application time Trm which is given by the following equation:

$$Trm = Cr \times (Vd/Vr) \times (Td/Cd)$$

where Cd is the number of cycles to deterioration, Td is a deterioration time that corresponds to the number of cycles to deterioration, Vd is the drive voltage, Vr is a reverse field applying voltage which is reverse to the specified drive voltage and which is applied between the substrate-side electrode and the obverse-surface-side electrode in order to form the reverse electric field, and Cr is the number of cycles to start of reverse field application.

Preferably, the piezoelectric film is PZT ($PbZrTiO_3$) and site A ions are Pb ions.

Preferably, the piezoelectric film is a thin film having a columnar grain boundary crystal structure.

According to the present invention, a drive electric field is applied to the piezoelectric film for a specified period of time, and in the subsequent drive standby period, a reverse electric field is applied for a specified period of time, whereby the site A ions in the piezoelectric film that have been attracted toward a negative electrode by the drive electric field can be pulled back to recover the deteriorated piezoelectric performance of the piezoelectric film. As a result, when another normal-mode drive is started, the piezoelectric device can be driven with its piezoelectric performance having been recovered; in other words, the durability of the piezoelectric device is improved.

DETAILED DESCRIPTION OF THE INVENTION

On the following pages, the method for driving a piezoelectric device according to the present invention is described in detail with reference to the preferred embodiment depicted in the accompanying drawings.

Figure 1:
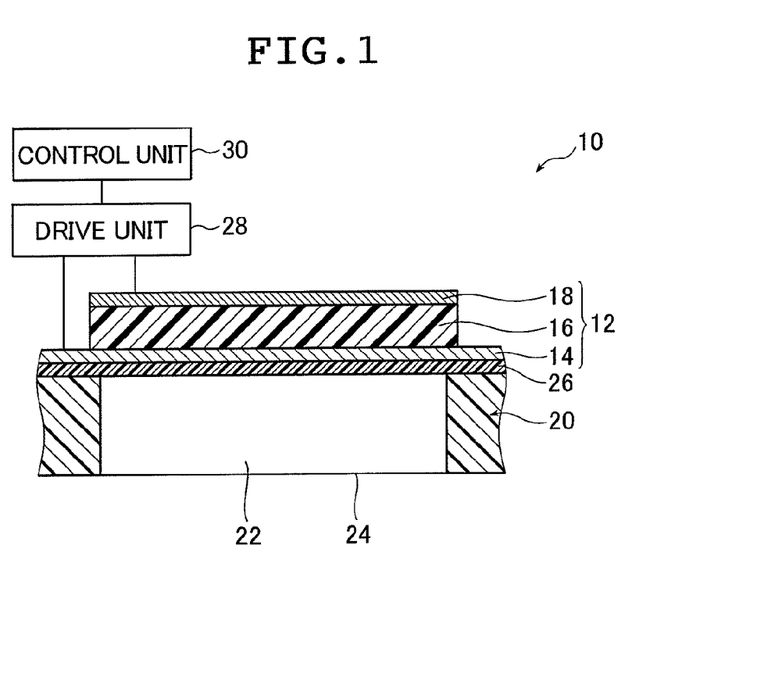
FIG. 1 is a cross-sectional view showing schematically an embodiment of an ink-jet recording head to which is applied the method for driving a piezoelectric device according to the present invention.

FIG. 1 is a cross-sectional view showing schematically one ejecting section in an ink-jet recording head (liquid ejecting apparatus) that utilizes a diaphragm-type piezoelectric actuator (hereinafter referred to as a piezoelectric actuator) to which is applied the method for driving a piezoelectric device according to the present invention.

One ejection unit of the ink-jet recording head (liquid ejecting apparatus) 10 comprises an ink nozzle (liquid storing/ejecting member) 20 overlaid via a diaphragm 26 with a piezoelectric device 12; the ink nozzle 20 comprises a substrate in which are formed an ink chamber (liquid reservoir) for storing ink and an ink ejection port (liquid ejection port) through which ink is ejected from the ink chamber 22 to the outside; the piezoelectric device 12 comprises a lower electrode (substrate-side electrode) 14, a piezoelectric film 16, and an upper electrode (obverse-surface-side electrode) 18 in the order written.

The ink-jet recording head 10 has a plurality of ejection units which share the lower electrode 14 and the ink nozzle 20.

A drive unit 28 is connected to each of the lower electrode 14 and the upper electrode 18. The drive unit 28 applies a voltage between the lower electrode 14 and the upper electrode 18 to drive the piezoelectric device 12.

A control unit 30 is connected to the drive unit 28. The control unit 30 sends a drive signal to the drive unit 28 to control its operation.

In the embodiment under consideration, the upper electrode 18 is used as a drive electrode and during normal drive, namely, during ink ejection, the piezoelectric device 12 is driven by applying a drive voltage to the upper electrode 18 in such a way that it functions as a negative electrode (electrode at low potential) whereas the lower electrode 14 functions as a positive electrode (electrode at high potential)

In the ink-jet recording head 10, the lower electrode 14 and the upper electrode 18 together apply an electric field to the piezoelectric film 16 across its thickness. In the embodiment under consideration, an electric field is applied in a direction from the lower electrode 14 to the upper electrode 18 during normal drive, or during ink ejection.

Then, the strength of the electric field being applied to the piezoelectric film 16 is adjusted to expand or contract the piezoelectric film 16, whereupon the capacity of the ink chamber 22 is varied to control the timing or amount of ink ejection from the ink chamber 22.

The ink-jet recording head 10 in the embodiment under consideration is fabricated by the following procedure: the reverse side of the substrate is dry etched or wet etched to form the ink chamber 22 of an open-loop structure; the substrate itself is processed to form the ink nozzle 20 and the diaphragm 26; thereafter, the piezoelectric device 12 is formed on the obverse side of the substrate.

In the embodiment under consideration, the ink nozzle 20 and the diaphragm 26 are formed as physically separate members; this is not the sole case of the present invention and instead of providing the diagram 26 as a separate member, a thin-walled portion that is formed in a position that corresponds to the piezoelectric film 16 as the result of forming the ink chamber 22 in the substrate may be utilized as the diaphragm 26 in the process of making the ink nozzle 20; in this case, the diaphragm 26 is formed as an integral part of the ink nozzle 20.

The embodiment under consideration is by no means limited to the above-described fabrication process and, if desired, the formation of the piezoelectric device 12 on the obverse side of the substrate may be followed by processing of its reverse side so as form the ink nozzle 20 and the diaphragm 26.

The substrate in which the ink nozzle 20 is to be formed is not limited in any particular way and examples include substrates of silicon, glass, stainless steel (SUS), yttrium-stabilized zirconia (YSZ), alumina, sapphire, and silicon carbide. The substrate may be a laminated substrate such as a SOI substrate which comprises a SiO₂ film and a Si active layer that are formed in superposition on top of a silicon substrate.

The primary component of the lower electrode 14 is not limited in any particular way and examples include metals such as Au, Pt and Ir, metal oxides such as IrO₂, RuO₂, LaNiO₃ and SrRuO₃, and combinations thereof.

The primary component of the upper electrode 18 is not limited in any particular way, either, and examples include not only the above-listed metals and metal oxides that can be used to make the lower electrode 14 but also those electrode materials such as Al, Ta, Cr and Cu that can commonly be shaped by semiconductor processes, and combinations thereof.

The thicknesses of the lower electrode 14 and the upper electrode 18 are not limited to any particular values and are preferably in the range of 50 to 500 nm.

In the embodiment under consideration, the piezoelectric film 16 is a film of piezoelectric element that is formed by vapor-phase growth techniques such as sputtering. The thickness of the piezoelectric film 16 is not limited to any particular value and is preferably between 10 nm and 100 µm, more preferably between 100 nm and 20 µm.

The piezoelectric film 16 is composed of one or more perovskite-type oxides (which may contain incidental impurities). The piezoelectric film 16 is preferably made of one or more perovskite-type oxides that are represented by the following general formula (P):

$$Pb(Ti_x, Zr_y, M_z)O_3 \quad\quad (P)$$

where Pb is a site A element; Ti, Zr and M are each a site B element; M is at least one metal element selected from the group consisting of Sn, Nb, Ta, Mo, W, Ir, Os, Pd, Pt, Re, Mno, Co, Ni, V and Fe; $0 \leq x \leq 1$, $0 \leq y \leq 1$, $0 \leq z \leq 1$, and $x+y+z=1$.

The molar ratio of Pb as the site A element to oxygen is basically 1:3 and so is the molar ratio of the site B element to oxygen, provided that a departure from 1:3 is tolerated within the range over which the perovskite structure can be realized.

If more than one element is used as the site B element, the total number of moles of the respective site B elements that is expressed by x+y+z typically assumes the value of unity when the number of moles of oxygen is assumed to be three; however, a departure from unity is tolerated within the range over which the perovskite structure can be realized.

Examples of the perovskite-type oxide that is represented by the general formula (P) include lead-containing compounds such as lead titanate, lead zirconate titanate (PZT), lead zirconate, and nickel niobate-zirconium lead titanate, as well as mixed crystals thereof.

Note that the piezoelectric film 16 is preferably formed under those conditions that are adapted for depositing thin films of piezoelectric elements that comprise perovskite crystals having a columnar grain boundary structure. Piezoelectric films that comprise perovskite crystals having a columnar grain boundary structure are preferably provided with high enough degree of orientation to possess high piezoelectric constants.

On the pages that follow, the method of driving a piezoelectric device according to the present invention is explained with reference to FIGS. 2 to 6 among the accompanying drawings.

Figure 2:
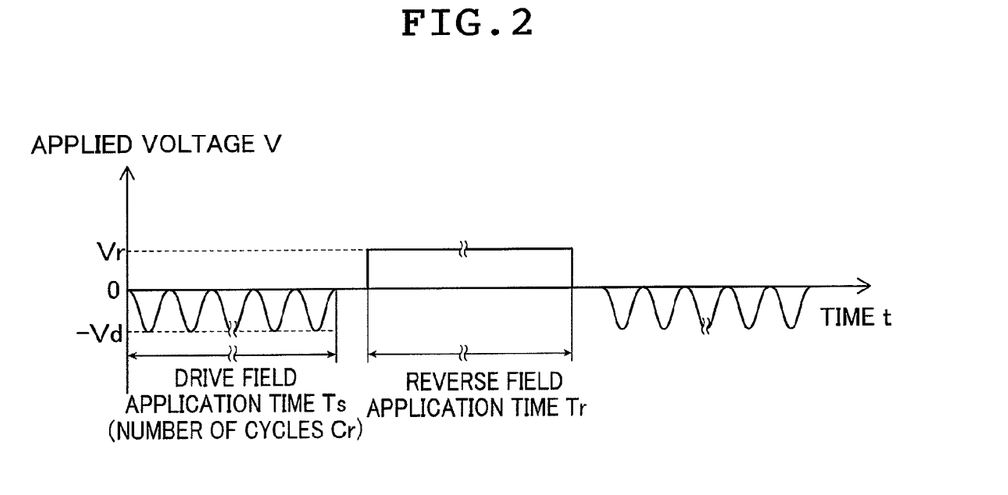
FIG. 2 is a graph showing schematically the method of the present invention for driving a piezoelectric device.

FIG. 2 is a graph depicting the method of the present invention for driving a piezoelectric device. The horizontal axis of the graph in FIG. 2 plots time and the vertical axis plots the voltage to be applied to the upper electrode IS serving as the drive electrode.

The plausible mechanism behind deterioration of the piezoelectric film 16 has already been described above: when an electric field is applied to the piezoelectric film 16, site A ions in the piezoelectric film 16 are attracted toward the negative electrode and the attracted site A ions contact moisture at high frequency on the negative electrode, whereupon a compound (e.g. oxide) of the site A element precipitates, causing an irreversible change in the composition of the piezoelectric film. Once the piezoelectric film 16 undergoes the above-described irreversible deterioration and its piezoelectric performance drops, the lowered piezoelectric performance cannot be restored.

A particular problem to note is that if the site A ions are attracted toward the upper electrode 18, they contact moisture at a higher frequency and the compound of the site A element is more likely to precipitate.

The present invention is based on the two findings, i.e., migration of site A ions in the piezoelectric film 16 causes a drop in its piezoelectric performance, and the precipitation of the site A ions as the compound of site A element, that is to say, precipitation of a compound of the site A element derived from site A ions causes an irreversible deterioration of the piezoelectric film 16, hence, an irreversible drop in its piezoelectric performance; the present invention has been accomplished in order to provide a method by which a piezoelectric device can be driven in such a way that it is protected against the above-described drop in piezoelectric performance to thereby improve the durability of the piezoelectric film.

Specifically, the present invention is characterized in that during a drive standby period for keeping the piezoelectric device 12 on standby, that follows the application of a drive electric field for normal drive to the piezoelectric film 16 for a specified period of time (designated "drive field application time TsT" in FIG. 2) and for which the normal drive of the piezoelectric film 16 is suspended, an electric field that is in opposite direction with respect to the drive electric field (hereinafter referred to as a reverse electric field) is applied to the piezoelectric film 16 for a specified period of time (designated "reverse field application time Tr" in FIG. 2) and, thereafter, the piezoelectric film 16 is again driven in normal mode.

As a result, the problem that site A ions in the piezoelectric film 16 are moved toward the negative electrode (the upper electrode 18 in the embodiment under consideration) by the drive electric field, whereupon the compound of the site A element precipitates near the negative electrode can be removed, to thereby prevent a drop in the piezoelectric performance of the piezoelectric film 16; thus, the piezoelectric device can be driven with the piezoelectric film exhibiting satisfactory piezoelectric performance.

The method of the present invention for driving the piezoelectric device involves a preliminary step of setting the "drive field application time Ts" which is the period of time for which the drive electric field for normal drive is applied and the "reverse field application time Tr" which is the period of time for which the reverse electric field is applied (hereinafter, the terms such as "electric field application time" and "electric field applying voltage" may simply referred to as "field application time," "field applying voltage" etc.). An exemplary method of setting these temporal parameters is hereunder described with reference to FIG. 5.

First, in a humid atmosphere with a temperature of 40° C. and a humidity of 80%, a voltage that has a maximum absolute value of Vd (V) in one cycle (which is hereinafter referred to as the drive voltage Vd) and which has a one-cycle period of N' (sec) is continuously applied to the upper electrode 18 which is the drive electrode in the piezoelectric device 12, whereby the piezoelectric device 12 is driven cyclically. By thusly driving the piezoelectric device 12 continuously through cycles, the number of cycles that can be run before deterioration of the piezoelectric film 16 occurs is found out (S1 in FIG. 5).

Figure 5:
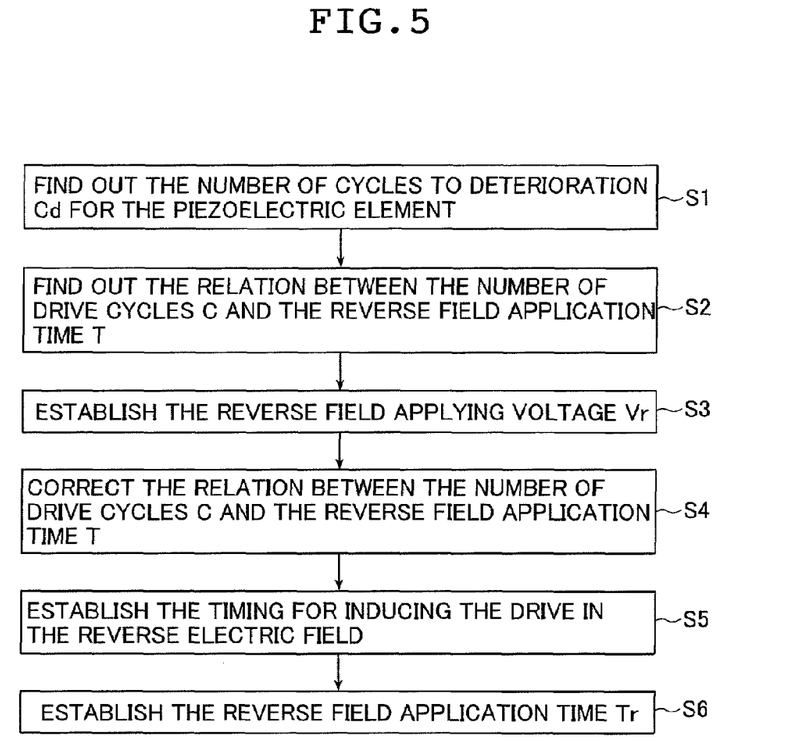
FIG. 5 is a flow sheet depicting an exemplary method for setting the drive conditions for drive with a reverse electric field.

The term "deterioration of the piezoelectric film 16" as used herein means an irreversible deterioration that occurs by the already explained mechanism: the drive electric field being applied to the piezoelectric film 16 during cyclic drive causes site A ions to be attracted toward the upper electrode 18 serving as the negative electrode and the attracted site A ions precipitate as a compound. The number of cycles that can be run before this irreversible deterioration occurs and the displacement of the piezoelectric film 16 begins to decrease is called the number of cycles that can be run before deterioration of the piezoelectric film 16 occurs and it shall be designated as the "number of cycles to deterioration Cd".

Subsequently, the relation between the number of drive cycles C and the reverse field application time T is found out from the relation between the number of drive cycles C and the deterioration time Td taken for the piezoelectric film 16 to deteriorate (S2 in FIG. 5).

Figure 3:
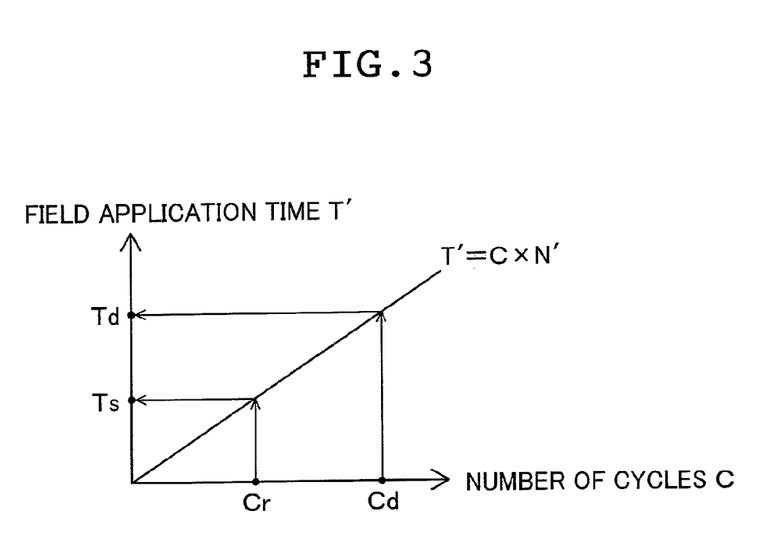
FIG. 3 is a graph illustrating the relation between the number of cycles to deterioration and the time to deterioration.

Specifically, (cycle period N')×(number of cycles to deterioration B) is calculated to thereby compute the deterioration time C, or the drive time for which the piezoelectric device 12 has been driven cyclically by the number of cycles to deterioration B and the time taken for the piezoelectric film 16 to deteriorate. The number of cycles to deterioration Cd and the deterioration time Td are plotted on a graph whose horizontal and vertical axes represent the number of cycles C and the drive field application time T', respectively, to thereby draw a straight line as shown in FIG. 3 which is represented by the following equation (1):

$$T'=C\times N' \qquad (1)$$

The drive field application time T' is the time for which the drive electric field was applied through a certain number of cycles C in the case of cyclic drive with the drive voltage Vd, so this may be taken as a guide for the deterioration of the piezoelectric film 16 such as the amount of migration of site A ions in the piezoelectric film 16, namely, the drop in piezoelectric constant due to the migration of site A ions.

Figure 4:
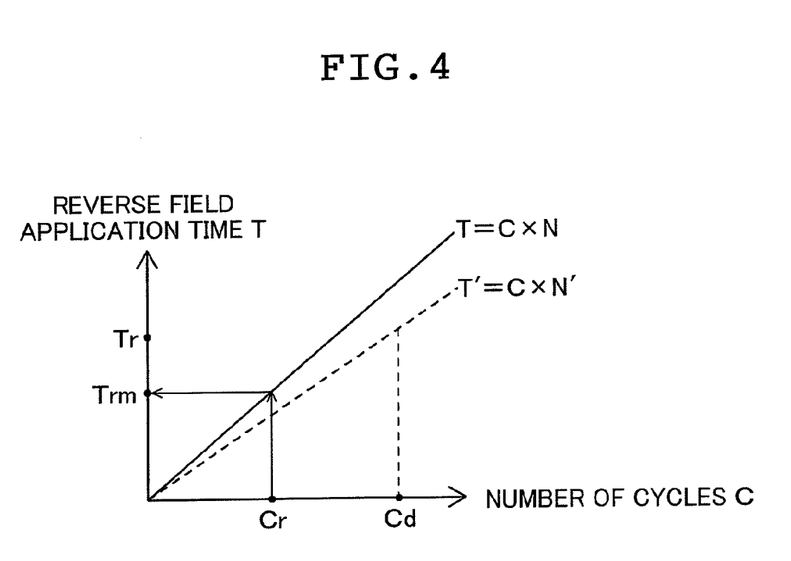
FIG. 4 is a graph illustrating the relation between the number of cycles and the reverse field application time.

Assume here the case of applying a reverse electric field with a voltage applied at a magnitude of Vd after the piezoelectric device 12 has been cyclically driven through a certain number of cycles C (for the drive field application time T' which corresponds to this number of cycles); then, the shortest reverse field application time T that is required to pull back the site A ions that have moved toward the negative electrode may be taken to be comparable to the time T' for which the drive electric field was applied. In the embodiment under consideration, the relation between the number of cycles A and the shortest reverse field application time T in the case of applying a reverse electric field with a voltage applied at a magnitude of Vd is given by the following equation (2) and shown by a dashed line in FIG. 4:

$$T=C\times N' \qquad (2)$$

Note here that in the present invention, the magnitude of the voltage between electrodes during the application of the reverse electric field (i.e., the reverse field applying voltage) is not limited to Vd. Since the shortest reverse field application time varies with the magnitude of the reverse field applying voltage that is actually applied, the above-noted equation (2) must be corrected accordingly and this point will be later described in detail.

In the next step, the reverse field applying voltage Vr is established (S3 in FIG. 5). In the embodiment under consideration, the reverse field applying voltage Vr is such that the upper limit of the strength of the reverse electric field to be applied to the piezoelectric film 16 is equal to the coercive electric field of the piezoelectric film 16 whereas the lower limit is equal to 10% of this coercive electric field. In other words, the upper limit of the strength of the reverse electric field is the strength of the coercive electric field whereas the lower limit is the strength equal to 10% of this coercive electric field.

The coercive electric field referred to above means an electric field whose strength is sufficient to invert the polarization of the piezoelectric film. If the reverse field applying voltage Vr applied is such that the reverse electric field becomes greater than the coercive electric field, the polarization of the piezoelectric film 16 might be inverted. If polarization inversion occurs, an electric field at least equal to the coercive electric field must be applied in the same direction as the drive electric field so that the inverted polarization is re-inverted to restore the initial polarization.

In the drive method of the present invention, the reverse electric field is applied for the purpose of ensuring that the site A ions attracted toward the upper electrode 18 by the drive electric field are pulled back to move toward the lower electrode 14 and the site A ions can be moved even if the reverse electric field is smaller than the coercive electric field.

Thus, by applying a reverse electric field not greater than the coercive electric force, the site A ions attracted toward the negative electrode can be pulled back without causing polarization inversion of the piezoelectric film and this contributes to preventing the decrease in piezoelectric performance.

The strength of the electric field to be applied to the piezoelectric film 16 is preferably as small as possible. If defects or the like are present in a thin piezoelectric film, the low withstand voltage of the defective areas become centers at which the applied electric field is concentrated to break the film. The probability that this defect-derived breakdown occurs is particularly high in the case of thin films. The occurrence of this breakdown can be suppressed by applying a smaller voltage and, hence, a less strong electric field.

However, the reverse electric field to be applied must be strong enough to cause migration of site A ions.

As described above, in the present invention, by applying a reverse electric field which is at least 10% of the coercive electric field, the site A ions attracted toward the negative electrode by the drive electric field can be pulled back to prevent the decrease in piezoelectric performance.

Note here that the strength of the coercive electric field of the piezoelectric film 16 may be preliminarily measured by experiment or the like using piezoelectric films formed under the same deposition conditions as with the piezoelectric film 16.

Subsequently, the relation between the number of drive cycles C and the reverse field application time T is corrected (S4 in FIG. 5).

As already mentioned above, the magnitude of the voltage between electrodes during the application of the reverse electric field (i.e., the reverse field applying voltage) is not limited to Vd and the above-noted equation (2) must be corrected according to the magnitudes of the reverse field applying voltage Vr and the drive voltage Vd that are actually applied.

The strength of the reverse electric field to be applied to the piezoelectric film 16 varies with the magnitude of the reverse field applying voltage. If the strength of the reverse electric field varies, so do the time taken to move site A ions and the shortest reverse field application time required to pull back the site A ions in the piezoelectric film.

For example, the migration of site A ions tends to occur within a shorter period of time in the stronger reverse electric field than in the less strong field.

Therefore, the relation between the reverse field application time T and the number of cycles C that is expressed by the above-noted equation (2) and which is indicated by the dashed line in FIG. 4 must be corrected according to the magnitude of the reverse electric field that is actually applied.

If the drive voltage is written as Vd and the proportionality constant as N, the relation between the number of cycles C through which the drive electric field has been applied in the case where the reverse field applying voltage is Vr and the shortest reverse field application time T required to pull back site A ions in the piezoelectric film is expressed by the following equation (3) and indicated by a solid line in FIG. 4:

$$T = C \times N = C \times (Vd/Vr) \times N' \quad (3)$$

In the embodiment under consideration, the reverse field application time T is roughly estimated on the assumption that it is proportional to Vd/Vr, or the ratio between the drive voltage Vd and the reverse field applying voltage Vr. Utilizing the corrected relation (3), we establish the reverse field application time Tr which is the time for which the reverse electric field is actually applied to the piezoelectric film.

Then, the timing for inducing the drive in the reverse electric field is established, namely, the timing on which the application of the drive electric field is ceased and switched over to the application of the reverse electric field is established (S5 in FIG. 5). In the embodiment under consideration, it is before the number of cycles C in the drive electric field reaches the number of cycles to deterioration Cd that the application of the drive electric field is ceased and the reverse electric field is applied. The number of cycles that have run before the application of the drive electric field is ceased and after which the application of the reverse electric field is started is designated as the number of cycles to the start of reverse field application Cr. The drive field application time Ts for this number of cycles to the start of reverse field application Cr is Ts=Cr×N' in view of the above-noted equation (1) and is shorter than the deterioration time Td, as shown in FIG. 3.

By adjusting the number of cycles to the start of reverse field application Cr to be less than the number of cycles to deterioration Cd, namely, by adjusting the drive field application time Ts to be less than the deterioration time Td, the application of the drive electric field can be ceased before the piezoelectric film 16 deteriorates irreversibly due to the precipitation of the compound of site A element.

In addition, by applying the reverse electric field before the compound of site A element precipitates, the piezoelectric performance of the piezoelectric film 16 that has dropped due to the application of the drive electric field can advantageously be regenerated to improve the durability of the piezoelectric film 16.

Subsequently, the reverse field application time Tr is established (S6 in FIG. 5). The reverse field application time Tr is longer than the minimum reverse field application time Trm, which will be described later.

Here, the minimum reverse field application time Trm is the lower limit of the reverse field application time that is required to restore the piezoelectric performance of the piezoelectric film 16 by pulling back the site A ions from the upper electrode 18 after they have migrated to that upper electrode by the drive electric field that was applied to the piezoelectric film 16 for the drive field application time Ts; the minimum reverse field application time Trm can be approximately known by utilizing the above-noted equation (3).

Specifically, the number of cycles A through which the drive electric field is applied for the length of time Ts is the number of cycles to the start of reverse field application Cr, so the shortest reverse field application time Trm can be calculated by Cr×N=Cr×(Vd/Vr)×N'.

Since the above-noted equation (1) can be rewritten as N'=Td/Cd, the shortest reverse field application time Trm can be expressed by the following equation (4):

$$Trm=Cr\times(Vd/Vr)\times Td/Cd \qquad (4)$$

Since Ts=Cr×N' in view of the above-noted equation (1), the shortest reverse field application time Trm and the drive field application time Ts are related to each other by Trm=(Vd/Vr)×Ts.

The reverse field application time Tr is established in accordance with the computed minimum reverse field application time Trm. In the present invention, by adjusting the reverse field application time Tr to be at least equal to the minimum reverse field application time Trm, the reverse electric field can be applied for the length of time that is required to restore the piezoelectric performance of the piezoelectric film 16 by pulling back the site A ions attracted toward the negative electrode by the applied drive electric field.

Note that as in the normal drive mode, the upper limit of the reverse field application time Tr may be so set that the site A ions that are moved toward the negative electrode by the reverse electric field will not precipitate as a compound of site A element to cause deterioration of the piezoelectric film.

In the manner described above, the number of cycles to the start of reverse field application Cr and the drive field application time Ts that are associated with the time at which the application of the drive electric field is ceased are established, and the reverse field application time Tr is also established as a time at least equal to the minimum reverse field application time Trm which corresponds to the number of cycles to the start of reverse field application Cr.

On the following pages, the method of the present invention for driving a piezoelectric device using the thus established drive field application time Ts and reverse field application time Tr is described with reference to the exemplary embodiment depicted in FIG. 6.

Figure 6:
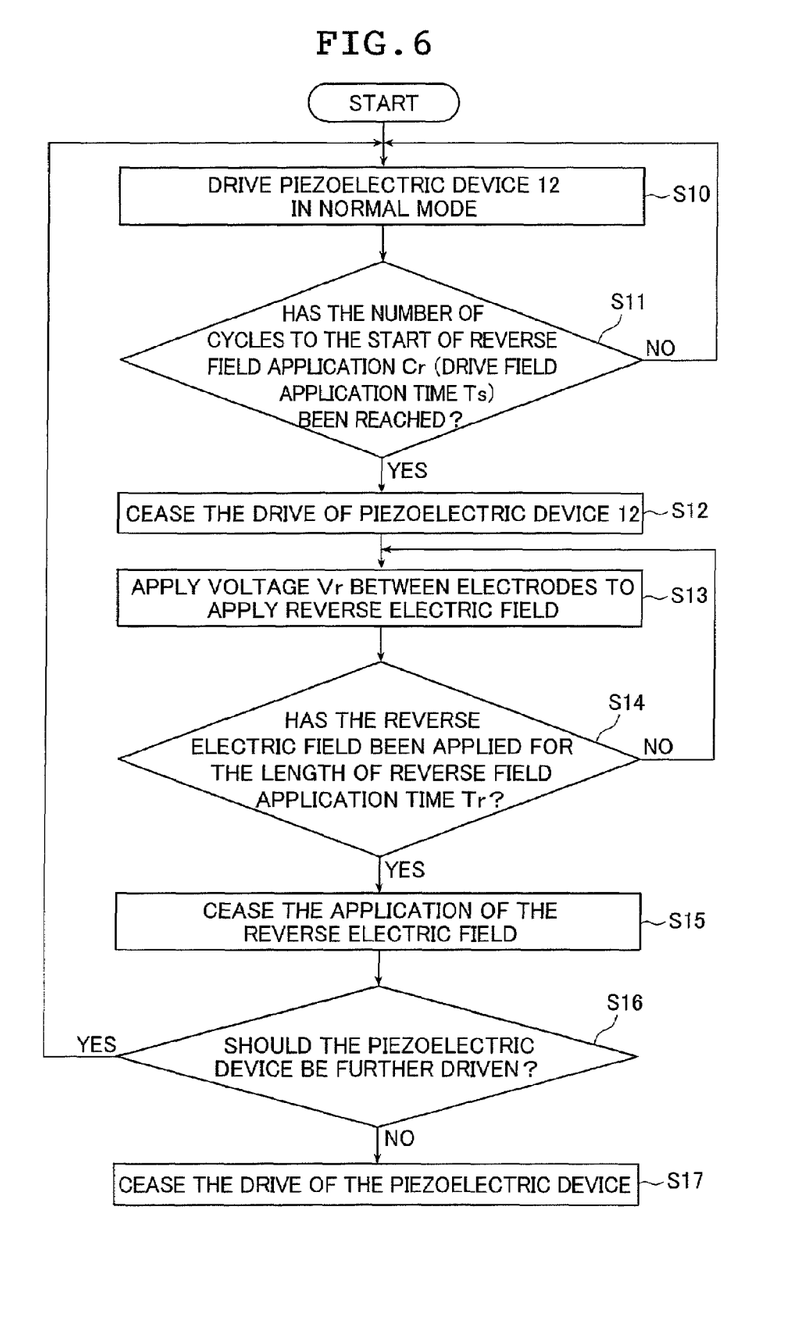
FIG. 6 is a flow sheet depicting an embodiment of the method for driving a piezoelectric device according to the present invention.

First, the drive unit 28, receiving a drive signal for normal drive from the control unit 30, causes the piezoelectric device 12 in the ink-jet recording head 10 to be driven in the normal mode (S10 in FIG. 6).

When the number of cycles C has reached a preset number of cycles to the start of reverse field application Cr so that the total period of time during which the drive voltage was applied is equal to the drive field application time Ts (=Cr× N'), the control unit 30 stops issuing the drive signal and the drive unit 28 accordingly stops the drive of the piezoelectric device 12 (S11 and S12 in FIG. 6).

Then, receiving a drive signal from the control unit 30 such that a reverse electric field that is in opposite direction to the drive electric field and which is not greater than the coercive electric field of the piezoelectric film 16 will be applied to the piezoelectric film 16, the drive unit 28 applies a voltage Vr between the lower electrode 14 and the upper electrode 18 (S13 in FIG. 6).

When the reverse electric field has been applied for the preset duration of the reverse field application time Tr, the control unit 30 stops issuing the drive signal for applying the reverse electric field and the drive unit 28 accordingly stops the application of the reverse electric field (S14 and S15 in FIG. 6).

If the drive of the piezoelectric device is to be continued in the subsequent period, the above-described steps are repeated: for each passage of the drive field application time Ts (in other words, for each occurrence of the number of cycles to the start of reverse field application Cr), the application of the drive electric field is ceased and the reverse electric field with a strength not greater than the coercive electric field is applied for the duration of reverse field application time Tr (516 in FIG. 6). If the drive of the piezoelectric device is to be ceased, its drive is stopped after completion of the above-described step S16 (S17 in FIG. 6).

According to the method of the present invention for driving a piezoelectric device, the reverse electric field is applied to the piezoelectric film for a specified period of time after the drive electric field was applied to the same piezoelectric film for a specified period of time, whereby the site A ions in the piezoelectric film that have been attracted toward the negative electrode by the drive electric field can be pulled back from the negative electrode so as to recover the piezoelectric performance of the piezoelectric film that has deteriorated due to the migration of the site A ions. As a result, when another normal-mode drive is started, the piezoelectric device can be driven with its piezoelectric performance having been recovered; in other words, the durability of the piezoelectric device is improved.

If the time during which the drive electric field is applied is adjusted to be equal to the above-described drive field application time Ts, in other words, by adjusting the number of cycles to the start of reverse field application Cr to be smaller than the number of cycles to deterioration Cd, the drive electric field can be removed and the reverse electric field can be applied before an irreversible deterioration occurs to the piezoelectric film; this prevents the occurrence of an irreversible deterioration in the piezoelectric film due to the migration of site A ions, thus contributing to an improved durability of the piezoelectric film.

In addition, according to the present invention, even in the case of using a piezoelectric film that has a columnar grain boundary structure and high piezoelectric constant, the precipitation of the site A ions as a compound of the site A element from the piezoelectric film can be effectively prevented to thereby maintain the piezoelectric performance of the piezoelectric film.

It is known that in a case like that of the present invention where site A ions are attracted to the upper electrode which is away from the substrate, a compound of the site A element is most likely to precipitate since the site A ions contact water at a particularly high frequency; even in this case, the present invention can advantageously prevent the precipitation of the compound of site A element.

As already noted, by adjusting the strength of the reverse electric field to be not greater than the coercive electric field of the piezoelectric film, the site A ions that have been migrated and attracted toward the negative electrode by the drive electric field can be pulled back from the negative electrode without inverting the polarization of the piezoelectric film.

In the foregoing embodiment, the drive voltage is applied during the normal drive mode in such a way that the upper electrode 18 serving as the drive electrode becomes a negative electrode but this is not the sole case of the present invention and the drive voltage may be applied to the upper electrode 18 in such a way that it becomes a positive electrode. If desired, the lower electrode 14 may be used as the drive electrode.

In other words, the present invention is not limited to the particular case where the upper electrode 18 is a lower-potential electrode and the lower electrode 14 a higher-potential electrode; alternatively, the upper electrode 18 may be a higher-potential electrode and the lower electrode 14 a lower-potential electrode.

In addition, the foregoing embodiment concerns an ink-jet recording head that uses a piezoelectric actuator fitted with the $Pb(Ti_x,Zr_y,M_z)O_3$-based piezoelectric film having the perovskite structure but this is not the sole case of the present invention and it may be applicable to various other apparatuses such as a micro-pump to which the piezoelectric actuator can be applied.

On the following pages, an example of the method for driving a piezoelectric device according to the present invention is described.

An ink-jet recording head that utilizes the diaphragm-type piezoelectric actuator used in the following example has the same configuration as the above-described ink-jet recording head 10.

The description of a more specific configuration of the apparatus follows. A Si substrate with a thickness of 500 μm was used as the substrate. On top of this Si substrate, a lower electrode, a piezoelectric film and an upper electrode were superposed in that order, with a 10-μm-thick diaphragm being interposed, to form a piezoelectric device. An ink chamber 22 was formed in the substrate at a position beneath the piezoelectric film to thereby form an ink nozzle. Although the ink chamber was formed by reactive ion etching, this is not the sole applicable method and it can be formed by etching the Si substrate by various dry or wet etching techniques.

To make the lower electrode, a 200-nm Ti layer and a 500-nm Ir layer were successively deposited by sputtering.

To make the upper electrode, a 50-nm Ti layer and a 200-nm Ir layer were successively deposited by sputtering.

To make the piezoelectric film, PZT (lead zirconate titanate) was deposited by sputtering. The piezoelectric film had a thickness of 5 μm. The deposition temperature was 550° C. and the other conditions for depositing the piezoelectric film were those that would enable the deposition of a crystal of perovskite-type PZT having a columnar grain boundary structure. In the Example under consideration, a cross section of the piezoelectric film was examined by SEM, verifying that the piezoelectric film had a satisfactory columnar grain boundary structure.

Using the above-described piezoelectric device, a durability test was conducted. First, the piezoelectric film, placed in an atmosphere with a temperature of 40° C. and a humidity of 80%, was impressed with a trapezoidal-wave voltage of Vd=15-20 V (in a trapezoidal-wave electric field of 3-4 kV/mm; period of one cycle=10 μsec), and the correlation between the number of cycles and the amount of displacement was investigated to evaluate the time-dependent displacement characteristics of the sample. In the Example under consideration, the piezoelectric device was driven in such a way that the upper electrode would have a negative potential; in other words, the upper electrode was a negative electrode.

As it turned out, the displacement of the sample that had been driven through $5\times10^4$ cycles decreased by 50%, indicating the deterioration of the piezoelectric film. For the displacement measurement, the reverse side of the SOI substrate that was away from the side where the piezoelectric film was deposited was structured by lithography and dry etching so as to fabricate a diaphragm structure, whose displacement was measured with a laser Doppler displacement meter.

The deterioration of the piezoelectric film was caused by the following mechanism: Pb ions were attracted toward the upper electrode at negative potential and deposited as a Pb compound (e.g., PbO), causing a drop in the piezoelectric performance, hence, a decreased amount of displacement. As it turned out, the Pb compound precipitated when the sample was driven through $10^4$ cycles. Thus, in the Example under consideration, the number of cycles to deterioration Cd was $10^4$.

An ink-jet recording head equipped with the piezoelectric device having the above-described time-dependent displacement characteristics was driven by the method of the present invention for driving piezoelectric devices with a view to evaluating its durability.

First, a DC electric field of 2 kV/mm was applied as the reverse electric field; the value of 2 kV/mm was chosen as one that was smaller in absolute terms from the coercive electric field of the piezoelectric PZT film, which was ±5 kV/mm.

Considering the results of the evaluation of displacement characteristics, the number of cycles to the start of reverse field application Cr, or at which the application of the drive electric field during the normal drive mode should be ceased was chosen at $5\times10^3$, less than $10^4$ which was the number of cycles to deterioration Cd at which the Pb compound would precipitate.

In the Example under consideration, the minimum reverse field application time Trm, as computed by the above-noted equation (3), was $C\times N=C\times(Vd/Vr)\times N'=0.1$ sec, where Cr $5\times10^3$, N'=10 μsec, and (Vd/Vr)=(strength of reverse electric field/strength of drive electric field). Considering the value of minimum reverse field application time Trm (=0.1 μsec), a longer time (5 min) was chosen as the reverse field application time Tr.

Thus, in the Example under consideration, each time the piezoelectric device was driven in the normal mode by applying the drive electric field through $5\times10^3$ cycles (drive field application time=0.1 sec), the DC reverse electric field (reverse field applying voltage Vr=2 kV) was applied to the piezoelectric film for 5 minutes. When no reverse electric field was applied to the piezoelectric film, driving through $5\times10^4$ cycles caused a decrease in the amount of its displacement and, hence, it was found to have deteriorated. On the other hand, when the piezoelectric film was driven under the conditions described above, it could withstand driving through as many as $3\times10^5$ cycles without a decrease in the amount of its displacement; it was therefore confirmed that the durability of the piezoelectric device was markedly improved.

It was also found that the longer the induction period of reverse field application, namely, the longer the drive field application time Ts, the greater was the need to extend the period over which the reverse electric field was to be applied; it was therefore clear that the minimum reverse field application time Trm was generally proportional to the drive field application time Ts.

On the other hand, it was verified that when the induction period of reverse field application was unduly long, namely, when the drive field application time Ts was unduly long, the Pb compound precipitated and that once it precipitated, there was no recovery of durability by application of the reverse electric field. Therefore, in the Example under consideration, the number of cycles that was smaller than the number of cycles to deterioration Cd ($=10^4$) at which the Pb compound would precipitate was chosen as the number of cycles to the start of reverse field application Cr ($5\times10^3$ in the Example), at which the drive electric field was removed. As a result, the irreversible deterioration of the piezoelectric PZT film due to the precipitation of the Pb compound could be prevented in the manner already described above.

While the method of driving piezoelectric devices according to the present invention has been described above in detail, it should be noted that the present invention is by no means limited to the foregoing embodiment and various improvements and modifications can be made without departing from the spirit and scope of the present invention.

What is claimed is:

1. A method of driving a piezoelectric device comprising a substrate, a substrate-side electrode formed on said substrate, a piezoelectric film formed on said substrate-side electrode and having a perovskite-type crystal structure represented by the general formula $Pb(Ti_x,Zr_y,M_z)O_3$, and an obverse-surface-side electrode formed on said piezoelectric film, comprising:
   a first drive step of applying a specified drive voltage between said obverse-surface-side electrode and said substrate-side electrode to drive said piezoelectric device during a first drive period;
   a standby step of suspending a drive of said piezoelectric device to keep said piezoelectric device on standby during a drive standby period; and
   a second drive step of applying said specified drive voltage between said obverse-surface-side electrode and said substrate-side electrode to drive said piezoelectric device during a second drive period that follows said first drive period,
   wherein during said drive standby period between said first drive period and said second drive period, a reverse electric field with respect to a drive electric field formed in said piezoelectric film by said specified drive voltage routinely applied during a drive of said piezoelectric device is applied to said piezoelectric film for a specified period of time.

2. The piezoelectric device driving method according to claim 1, wherein said drive electric field is applied in such a direction that site A ions in said piezoelectric film are attracted toward said obverse-surface-side electrode.

3. The piezoelectric device driving method according to claim 1, wherein strength of said reverse electric field is not greater than a coercive electric field of said piezoelectric film.

4. The piezoelectric device driving method according to claim 3, wherein said strength of said reverse electric field is at least 10% of said coercive electric field of said piezoelectric film.

5. The piezoelectric device driving method according to claim 1, wherein said reverse electric field is formed by applying a reverse field applying voltage which is reverse to said specified drive voltage between said substrate-side electrode and said obverse-surface-side electrode, said reverse field applying voltage being not greater than a DC voltage that forms said coercive electric field of said piezoelectric film.

6. The piezoelectric device driving method according to claim 5, wherein said reverse field applying voltage is at least equal to a DC voltage that forms an electric field with a strength which is 10% of said coercive electric field of said piezoelectric film.

7. The piezoelectric device driving method according to claim 1, wherein said first drive period is a time that corresponds to a number of cycles to start of reverse field application at a point in time when application of said reverse electric field is started, the number of cycles to start of reverse field application being set on the basis of but smaller than a number of cycles to deterioration that represents a range from start of continuously driving said piezoelectric device through cycles with said specified drive voltage to a time when a compound of a site A element that has been generated by reaction between site A ions and moisture that is present at said obverse-surface-side electrode toward which the site A ions have been attracted by said drive electric field, and wherein said specified period of time for which said reverse electric field is applied to said piezoelectric film is a reverse field application time that is set in accordance with the number of cycles to start of reverse field application.

8. The piezoelectric device driving method according to claim 1, wherein said first drive period is a time that corresponds to a number of cycles to start of reverse field application at a point in time when application of said reverse electric field is started, the number of cycles to start of reverse field application being set on the basis of but smaller than a number of cycles to deterioration that represents a range from start of continuously driving said piezoelectric device through cycles with said specified drive voltage to a time when an amount of displacement of the piezoelectric film begins to decrease, and wherein said specified period of time for which said reverse electric field is applied to said piezoelectric film is a reverse field application time that is set in accordance with the number of cycles to start of reverse field application.

9. The piezoelectric device driving method according to claim 7, wherein said reverse field application time Tr is at least equal to a minimum reverse field application time Trm which is given by the following equation:

$$Trm = Cr \times (Vd/Vr) \times (Td/Cd)$$

where Cd is the number of cycles to deterioration, Td is a deterioration time that corresponds to the number of cycles to deterioration, Vd is the drive voltage, Vr is a reverse field applying voltage which is reverse to said specified drive voltage and which is applied between said substrate-side electrode and said obverse-surface-side electrode in order to form said reverse electric field, and Cr is the number of cycles to start of reverse field application.

10. The piezoelectric device driving method according to claim 1, wherein said piezoelectric film is PZT ($PbZrTiO_3$) and site A ions are Pb ions.

11. The piezoelectric device driving method according to claim 1, wherein said piezoelectric film is a thin film having a columnar grain boundary crystal structure.

* * * * *